United States Patent [19]

Hersener et al.

[11] Patent Number: 4,647,517
[45] Date of Patent: Mar. 3, 1987

[54] MASK FOR X-RAY LITHOGRAPHY

[75] Inventors: Jürgen Hersener, Ulm; Hans-Joest Herzog, Neu-Ulm; Karl Strohm, Ulm, all of Fed. Rep. of Germany

[73] Assignees: Licentia Patent-Verwaltungs-GmbH, Frankfurt; Telefunken electronic GmbH, Heilbronn, both of Fed. Rep. of Germany

[21] Appl. No.: 751,842

[22] Filed: Jul. 3, 1985

[30] Foreign Application Priority Data

Jul. 7, 1984 [DE] Fed. Rep. of Germany ....... 3425063

[51] Int. Cl.$^4$ ................................................ G03F 9/00
[52] U.S. Cl. ........................................ 430/5; 430/321; 378/35; 428/704
[58] Field of Search ................ 430/5, 321, 966; 378/34, 35; 428/195, 448, 704

[56] References Cited

U.S. PATENT DOCUMENTS 3,742,230 6/1973 Spears et al. ............... 250/65 R
4,468,799 8/1984 Harms et al. ....................... 378/35

FOREIGN PATENT DOCUMENTS 0104685 4/1984 European Pat. Off. .
3215316 10/1983 Fed. Rep. of Germany .

OTHER PUBLICATIONS

Wilson et al, *Ion Beams with Applications to Ion Implantation*, J. Wiley & Sons, New York, 1973.

Primary Examiner—Roland E. Martin
Assistant Examiner—José G. Dees
Attorney, Agent, or Firm—Spencer & Frank

[57] ABSTRACT

The invention relates to a mask for X-ray lithography, in particular, for the manufacture of VLSI semiconductor components, which is economical and reliable in its manufacture. The mask should transfer absorber structures down to the submicron range. Lateral mechanical distortions are avoided by a tension-compensated carrier membrane of simultaneously B and Ge doped silicon. This carrier membrane is also optically more transparent than known Si membranes doped only with B, which facilitates optical alignment of the mask.

7 Claims, 1 Drawing Figure

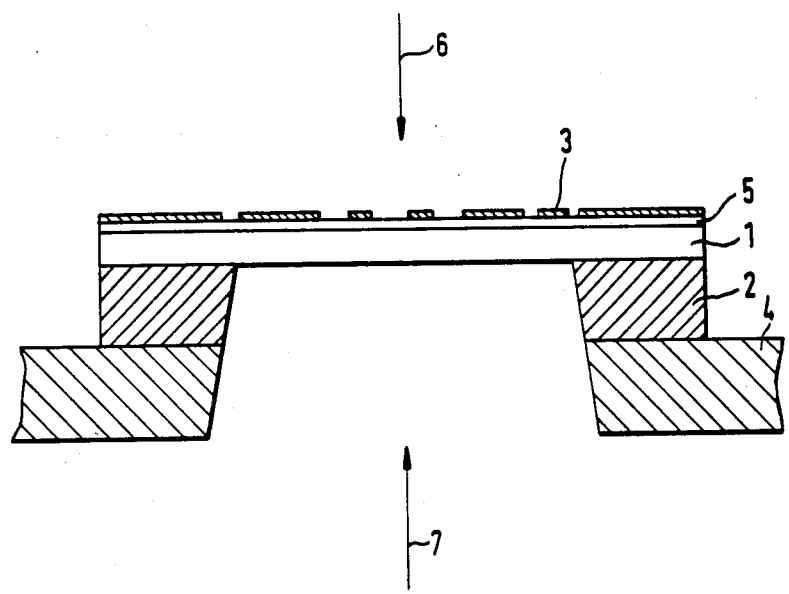

MASK FOR X-RAY LITHOGRAPHY

BACKGROUND OF THE INVENTION

The invention relates to a mask for X-ray lithography, in particular, for pattern generation on a semiconductor substrate coated with radiation-sensitive resist, consisting of a substantially radiation-transmissive carrier, with a geometrically structured absorber layer arranged thereon.

Such a mask is known from European patent application EP-O No. 104 685 A2. It is particularly for the manufacture of semiconductor components in a so-called VLSI technique (very large scale integration) that exposure masks enabling manufacture of semiconductor structures which lie in the range of one micrometer and below are required. Such small geometric structures are transferred, for example, by means of X-ray light from the mask onto a semiconductor wafer, the substrate, coated with X-ray-light-sensitive resist, and are then developed and further processed with the techniques commonly used in semiconductor technology, for example, with the aid of diffusion processes and also etching procedures. The manufacture of such VLSI semiconductor components requires several exposure, diffusion and etching procedures to be performed chronologically, with differently structured masks. These masks must be aligned with respect to the structures already present on the substrate, for example, with the aid of suitable alignment marks. Such alignment procedures necessitate a precision (tolerance) of less than 0.1 $\mu$m. The current economic situation furthermore demands a manufacturing process of such VLSI semiconductor components which is economical and involves as little time as possible.

SUMMARY OF THE INVENTION

The object underlying the invention is therefore to provide a mask which may be manufactured in a reliable and economical manner within a short period of time, whose mechanical distortions, in particular, those of the absorber structure, are negligibly small, and which enable an economical alignment technique.

This object is attained in that the carrier consists of a silicon containing, substantially monocrystalline membrane (1) which is held under mechanical tension by a silicon containing, substantially monocrystalline ring (2) located in its edge area on the side of the membrane (1) remote from the absorber layer (3), in that the membrane (1) is doped so as to produce therein a predictable mechanical state of tension, by means of which disturbing mechanical distortions in the membrane (1) and the ring (2) are avoidable, and in that the thickness and also the doping of the membrane (1) are selected such that it has a transmissibility in the visible spectral range which is adequate for alignment procedures. Expedient embodiments and further developments are apparent from the subclaims.

An advantage of the invention is that the membrane permits the transmission of visible light with a wavelength range of approximately 400 nm to 800 nm at locations not covered by the (X-ray) absorber layer. This enables economical performance of light-optical (mask) alignment procedures. Additional light-transmitting (alignment) windows are not required in the mask. Such windows produce disturbing mechanical tensions in the mask, which result in undesired mechanical distortions in the mask or even increase its likelihood of breakage.

DESCRIPTION OF THE PREFERRED EMBODIMENT

The schematic FIGURE shows a cross-section through a circular-disc-shaped mask with an outside diameter of approximately 75 mm.

The carrier, on which the (X-ray-light) absorber layer 3 is arranged, consists of a silicon (Si) containing, approximately 2 $\mu$m thick membrane 1, which is subjected to mechanical tension by an Si containing, approximately 0.4 mm thick and 12.5 mm wide ring 2 in such a way that mechanical distortions in the membrane 1 and the ring 2 are avoided. Mechanical distortions in the geometric structures of the absorber layer 3 within a range of around 0.1 $\mu$m or even smaller are thereby attained.

A diffusion barrier layer 5, for example, a silicon nitride layer and/or a silicon dioxide layer with a thickness of approximately 80 nm is first applied to the entire surface of the membrane 1. Such a diffusion barrier layer 5 prevents, on the one hand, diffusion of the material of the subsequently applied absorber layer 3 into the membrane 1 and vice-versa, and acts, on the other hand, as an anti-reflection layer ($\lambda/4$-layer) for visible light.

An exemplary manufacture of such a mask is based on a circular monocrystalline silicon (Si) wafer with a so-called (100)-crystal orientation, a diameter of approximately 75 mm and a thickness of approximately 0.4 mm. Such a Si wafer is an economical starting material for the production of semiconductor components. In an epitaxial process, an Si layer simultaneously doped with boron and germanium is deposited on the side of the Si wafer marked by the arrow 6. The epitaxial layer produced has a thickness of approximately 2 $\mu$m, in accordance with the thickness of the membrane 1 to be produced. The boron doping produces an electrically p-conducting Si semicondutor layer with a p-doping whose concentration is larger than $7 \times 10^{19}$ cm$^{-3}$. A layer doped in such a way with boron acts advantageously as an etch stopping layer, which will be explained hereinafter. This high boron doping does, however, have the disadvantage that boron has a smaller covalent radius than silicon. This results in mechanical tensions in the boron doped layer, which would cause an uncontrollable contraction of such a membrane, and disturbing and also unpredictable mechanical distortions in the structures of the absorber layer 3 would occur. This high boron doping furthermore disadvantageously causes lattice defects at the boundary layer to the undoped silicon located thereunder. On the one hand, these lattice defects bring about a disturbing reduction in the mechanical stability of the membrane 1 and, on the other hand, cause a disturbing scatter refraction of the visible light, whereby the above-mentioned economical optical alignment procedure is impeded or even rendered impossible. These disadvantages are avoided by the aforementioned germanium (Ge) doping, since germanium has a larger covalent radius than silicon. Particularly the mechanical tensions occurring on account of the boron doping can therefore be completely compensated by the Ge doping. It is, however, of advantage not to completely compensate these tensions in order to prevent a deformation of the finished mask, for example, a sagging caused by the dead weight of membrane and absorber layer. It is expedient to select a boron doping of approximately $1.5 \times 10^{20}$ cm$^{-3}$ and also a germanium doping of approximately $13 \times 10^{20}$ cm$^{-3}$. The diffusion barrier layer 5 is then applied to the layer doped in such a way, for example, by a technique commonly used in semiconductor technology, for example, a CVD process.

Finally, the absorber layer 3 is applied, for example, by vapor deposition and subsequent galvanic reinforcement. The necessary structuring is possible by, for example, etching processes adapted to the absorber material. Suitable as material for the absorber layer 3 are heavy metals, for example, titanium (Ti) and gold, chromium (Cr) and gold (Au) and/or an alloy of the Invar type. The latter advantageously enables additional temperature compensation of the mask, in accordance with German laid open patent application No. 32 15 316.

The thus prefrabricated Si wafer is now masked on the side remote from the absorber layer 3, in accordance with the ring 2 to be manufactured, for example, by means of an applied oxide with a window etched therein. The now freely exposed silicon in the area of the window is uniformly etched away in the direction of second arrow 7, for example, with the aid of a solution of ethylenediamine, pyrocatechol and water, a so-called EDP etching solution. This etching procedure acts selectively and solely on the undoped silicon and is terminated automatically at the aforementioned B-Ge-doped layer. The desired mask is produced.

The mask may be mechanically further reinforced by a correspondingly shaped mechanical carrier body 4 which is attached to the ring 2, for example, by adhesion. Alternatively, it is possible to attach the carrier body 4 to the silicon wafer prior to the etching with EDP solution and to perform the aforementioned etching process subsequently.

The invention is not limited to the above-described embodiment, but may be analogically applied to others. It is, for example, possible to manufacture the aforementioned B and Ge doped Si layer by diffusion and/or implantation and/or molecular beam epitaxial processes.

What is claimed is:

1. A mask for X-ray lithography, comprising:
    a substantially X-ray radiation-transmissive carrier consisting of a silicon containing, substantially monocrystalline membrane having a first side and a second side and a silicon containing, substantially monocrystalline ring located on the first side of the membrane for holding the membrane under mechanical tension;
    a diffusion barrier layer covering the second side of the membrane; and
    a geometrically structural absorber layer arranged on the diffusion barrier on the side thereof remote from the second side of the membrane,
    wherein the membrane is simultaneously doped with both boron and germanium so as to produce therein a predictable mechanical state of tension, which state of tension depends on the concentrations of the boron and the germanium, respectively, whereby disturbing mechanical distortions in the membrane and the ring are made negligibly small, and
    wherein the membrane has a thickness and concentrations of boron and germanium, respectively, which are selected so as to provide the membrane with a transmissibility in the visible spectral range which is adequate for mask alignment procedures.

2. The mask according to claim 1, wherein a mechanical carrier body is provided and is attached to the ring for further mechanical stabilization of the membrane and the ring.

3. The mask according to claim 2, wherein the mechanical carrier body consists of at least one of glass and an iron nickel alloy of the Invar type, and has a thermal expansion coefficient adapted to correspond that of Si, at least in the operating temperature range of the mask.

4. The mask according to claim 1, wherein the diffusion barrier layer contains at least one of silicon nitride and silicon dioxide.

5. The mask according to claim 1, wherein the diffusion barrier layer is in the form of an antireflection layer for light in the visible spectral range used in mask alignment procedures.

6. The mask according to claim 1, wherein the absorber layer contains at least one of at least one heavy metal and one alloy of the Invar type.

7. The mask according to claim 1, wherein the absorber layer and the membrane are comprised of materials selected such that distortion differences between the absorber layer and the membrane due to temperature changes are made negligibly small, at least in the operating temperature range of the mask.

* * * * *